(12) United States Patent
Oh et al.

(10) Patent No.: US 8,228,754 B2
(45) Date of Patent: Jul. 24, 2012

(54) ROUTING ACCESS WITH MINIMIZED BUS AREA IN MULTI-PORT MEMORY DEVICE

(75) Inventors: Chi-Sung Oh, Gunpo-si (KR); Jung-Sik Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1301 days.

(21) Appl. No.: 11/977,101

(22) Filed: Oct. 23, 2007

(65) Prior Publication Data

US 2009/0059711 A1 Mar. 5, 2009

(30) Foreign Application Priority Data

Aug. 29, 2007 (KR) .................. 10-2007-0086990

(51) Int. Cl.
*G11C 8/00* (2006.01)

(52) U.S. Cl. ............... 365/230.05; 365/230.03

(58) Field of Classification Search .......... 365/230.02, 365/230.03, 230.05
See application file for complete search history.

(56) References Cited

U.S. PATENT DOCUMENTS

| 2003/0093628 | A1 | 5/2003 | Matter et al. | |
| 2007/0150668 | A1* | 6/2007 | Kwon et al. | 711/149 |
| 2007/0150669 | A1* | 6/2007 | Ahn et al. | 711/150 |
| 2008/0077937 | A1* | 3/2008 | Shin et al. | 719/312 |

OTHER PUBLICATIONS

International Publication No. WO 2006/101292 to Jeong, having Publication date of Sep. 28, 2006 (w/ English Abstract page).
Japanese Patent Publication No. 2002-189704 having Publication date of Jul. 5, 2002 (w/ English Abstract page).
Korean Patent Registration No. 10-0655081 having Registration date of Dec. 1, 2006 (w/ English Abstract page).

* cited by examiner

*Primary Examiner* — VanThu Nguyen
*Assistant Examiner* — Khamdan Alrobaie
(74) *Attorney, Agent, or Firm* — Monica H. Choi

(57) ABSTRACT

A multi-port memory device includes first and second ports, a first dedicated memory area assigned to the first port, a plurality of shared memory units having shared access by the first and second ports, a first set of I/O lines for the first dedicated memory area, and a second set of I/O lines for the shared memory units with the second set having more I/O lines than the first set. For example, the second set has N times more I/O lines than the first set, with N being a number of ports of the multi-port memory device or with N being a number of shared memory banks in a shared memory area.

12 Claims, 13 Drawing Sheets

US 8,228,754 B2

ROUTING ACCESS WITH MINIMIZED BUS AREA IN MULTI-PORT MEMORY DEVICE

CLAIM TO PRIORITY

This application claims priority under 35 USC §119 to Korean Patent Application No. 10-2007-0086990, filed on Aug. 29, 2007 in the Korean Intellectual Property Office, the disclosure of which is incorporated herein in its entirety by reference.

TECHNICAL FIELD

The present invention relates generally to multi-port memory devices, and more particularly, to routing access in a multi-port memory device with minimized bus area.

BACKGROUND OF THE INVENTION

FIG. 1 shows a block diagram of a multi-port memory device 100 including a first port 102, a second port 104, a memory core 105, and an authority controller 107. The memory core 105 includes an array of memory cells that are organized into a first memory bank 106, a second memory bank 108, a third memory bank 110, and a fourth memory bank 112.

The first memory bank 106 is dedicated for access just by a first data processor 113 via the first port 102. The third and fourth memory banks 110 and 112 are dedicated for access just by a second data processor 115 via the second port 104. The second memory bank 108 has shared access by the first and second data processors 113 and 115 via the first and second ports 102 and 104, respectively.

Just one of the ports 102 and 104 has access to the shared memory bank 108 at any given time. The access controller 107 arbitrates access to the shared memory bank 108 between the ports 102 and 104. On the other hand, the first port 102 has access to its dedicated bank, i.e., the first memory bank 106, at any time. Similarly, the second port 104 has access to its dedicated banks, i.e., the third and fourth memory banks 110 and 112, at any time.

FIG. 2A illustrates the memory banks 106, 108, 110, and 112 when the memory core 105 is for 512 Mb (Mega-bit) memory capacity, according to the prior art. In that case, each of the memory banks 106, 108, 110, and 112 is for 128 Mb. FIG. 2B illustrates the memory banks 106, 108, 110, and 112 when the memory core 105 is for 1.024 Gb (Giga-bit) memory capacity, according to the prior art. In that case, each of the memory banks 106, 108, 110, and 112 is for 256 Mb. In FIGS. 2A and 2B, each of the memory banks 106, 108, 110, and 112 has same memory capacity in the memory core 105.

In the prior art of FIGS. 2A and 2B, each of the first and second data processors 113 and 115 uses a same addressing scheme with a same memory capacity per bank for accessing the memory core 105. Thus, a similar number and configuration of addressing bits are used by the first and second data processors 113 and 115 for accessing the memory core 105 in the prior art. For example, a similar number and position of bits for specifying bank and row addresses of the memory core 105 are used by the first and second data processors 113 and 115 in the prior art.

However, more flexibility may be desired for addressing the memory core 105 by the first and second data processors 113 and 115 in a multi-port memory device. In addition, routing access to the memory core 105 by the first and second data processors 113 and 115 with minimized bus area is desired in a multi-port memory device.

SUMMARY OF THE INVENTION

Accordingly, in a general aspect of the present invention, a multi-port memory device includes first and second ports, a first dedicated memory area assigned to the first port, a second dedicated memory area assigned to the second port, and a plurality of shared memory units. The first port generates a respective bank address for specifying access to each of the shared memory units, and the second port generates both a respective bank address and a respective row address for specifying each of the shared memory units.

In an embodiment of the present invention, the first port accesses the first dedicated memory area and the shared memory units with a first set of address bits that indicate a first memory size per bank. In addition, the second port accesses the second dedicated memory area and the shared memory units with a second set of address bits that indicate a second memory size per bank that is different from the first memory size per bank.

In another embodiment of the present invention, the multi-port memory device further includes first and second row decoders. The first row decoder indicates a selected row to be accessed by the first port by decoding the first set of address bits. The second row decoder indicates a selected row to be accessed by the second port by decoding the second set of address bits.

In another aspect of the present invention, a multi-port memory device includes a plurality of shared memory units, first and second ports, first and second dedicated memory areas, and a shared multiplexer. Each of the plurality of shared memory units has a respective set of I/O lines and I/O drivers/sensors. The first and second ports share access to the shared memory units, and the first and second dedicated memory areas are assigned to the first and second ports, respectively. The shared multiplexer routes respective access from each of the first and second ports to a respective one of the shared memory units according to port authority. In addition, the respective set of I/O lines and I/O drivers/sensors are used for respective routed access to each of the shared memory units.

In one embodiment of the present invention, the multi-port memory device further includes a respective multiplexer for routing respective access from each of the first and second ports between the shared multiplexer and a respective one of the first and second dedicated memory areas according to a respective address. In that case, the multi-port memory device also includes a respective set of I/O lines and I/O drivers/sensors that are used for respective routed access to each of the first and second dedicated memory areas.

In an example embodiment of the present invention, the I/O lines are global I/O lines, the I/O drivers are global I/O line drivers, and the I/O sensors are I/O sense amplifiers coupled to the global I/O lines. In that case, the memory device further includes a respective set of CSLs (column select lines) formed for each of the shared memory units and each of the dedicated memory areas.

In another aspect of the present invention, a multi-port memory device includes first and second ports, a first dedicated memory area assigned to the first port, a plurality of shared memory units having shared access by the first and second ports, a first set of I/O lines for the first dedicated memory area, and a second set of I/O lines for the shared memory units with the second set having more I/O lines than the first set. For example, the second set has N times more I/O lines than the first set, with N being a number of ports of the multi-port memory device or with N being a number of the shared memory units.

In another embodiment of the present invention, the multi-port memory device further includes a respective set of I/O drivers/sensors for routing access to each of the shared memory units by the first and second ports. In addition, the multi-port memory device also includes local multiplexers, each coupling data from one of the shared memory units to a selected one of the I/O lines for the first and second ports according to port authority.

In a further embodiment of the present invention, the multi-port memory device also includes a second dedicated memory area assigned to the second port, a third set of I/O lines for the second dedicated memory area with the second set having more I/O lines than the third set, and a respective multiplexer for routing respective access for each of the first and second ports between the shared memory units and a respective one of the first and second dedicated memory areas.

In a further embodiment of the present invention, the multi-port memory device also includes a respective set of I/O drivers/sensors formed for each of the first and second dedicated memory areas. In an example embodiment of the present invention, a respective set of I/O drivers/sensors are shared between the shared memory units and one of the dedicated memory areas.

The present invention may be used to particular advantage when the memory device is a DRAM (dynamic random access memory) device, and the shared memory units are shared memory blocks of at least one shared memory bank. However, the present invention may be applied for other types of multi-port memory devices.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, and 15 refer to elements having similar structure and/or function.

DETAILED DESCRIPTION

Figure 1:
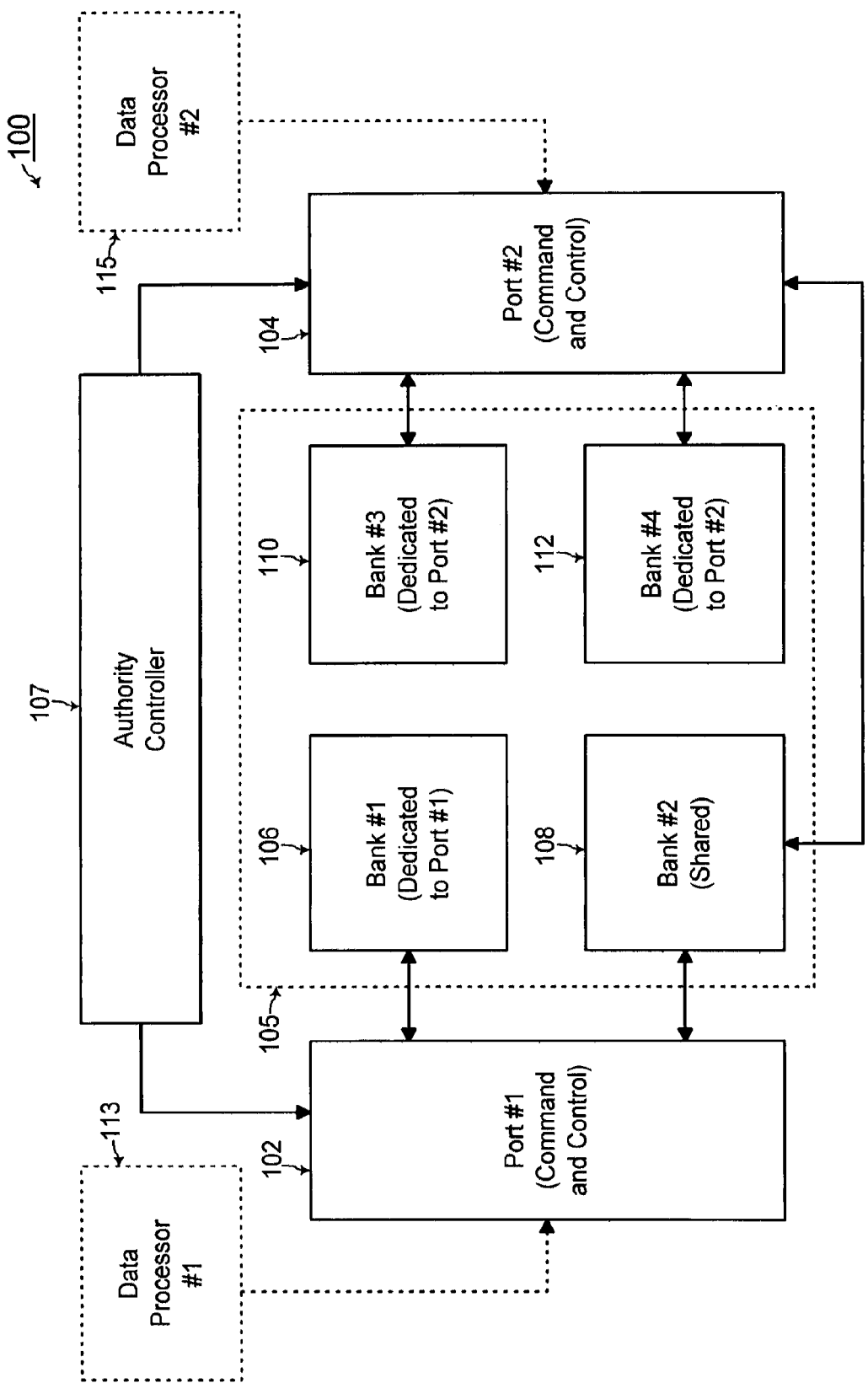
FIG. 1 shows a block diagram of a multi-port memory device, according to the prior art.
Figure 2B:
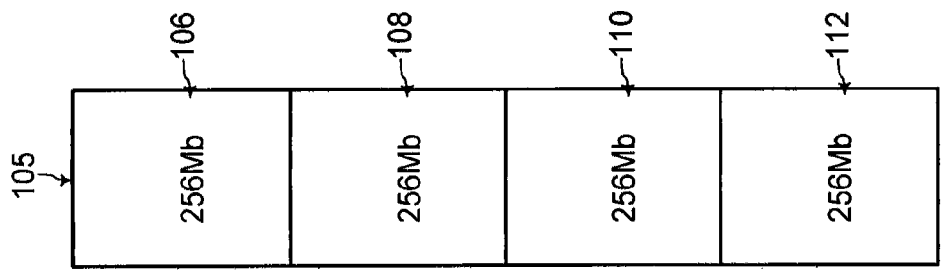
FIGS. 2A and 2B illustrate configuration of a memory core of FIG. 1 with a same memory capacity per bank for multiple ports, according to the prior art.
Figure 2A:
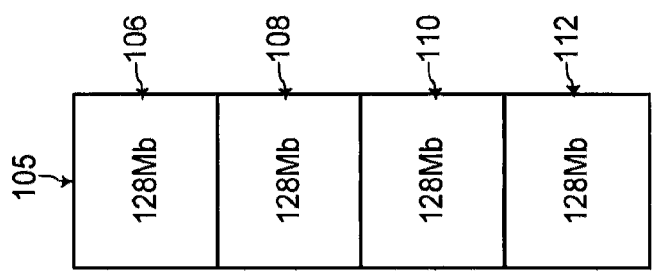
Figure 3:
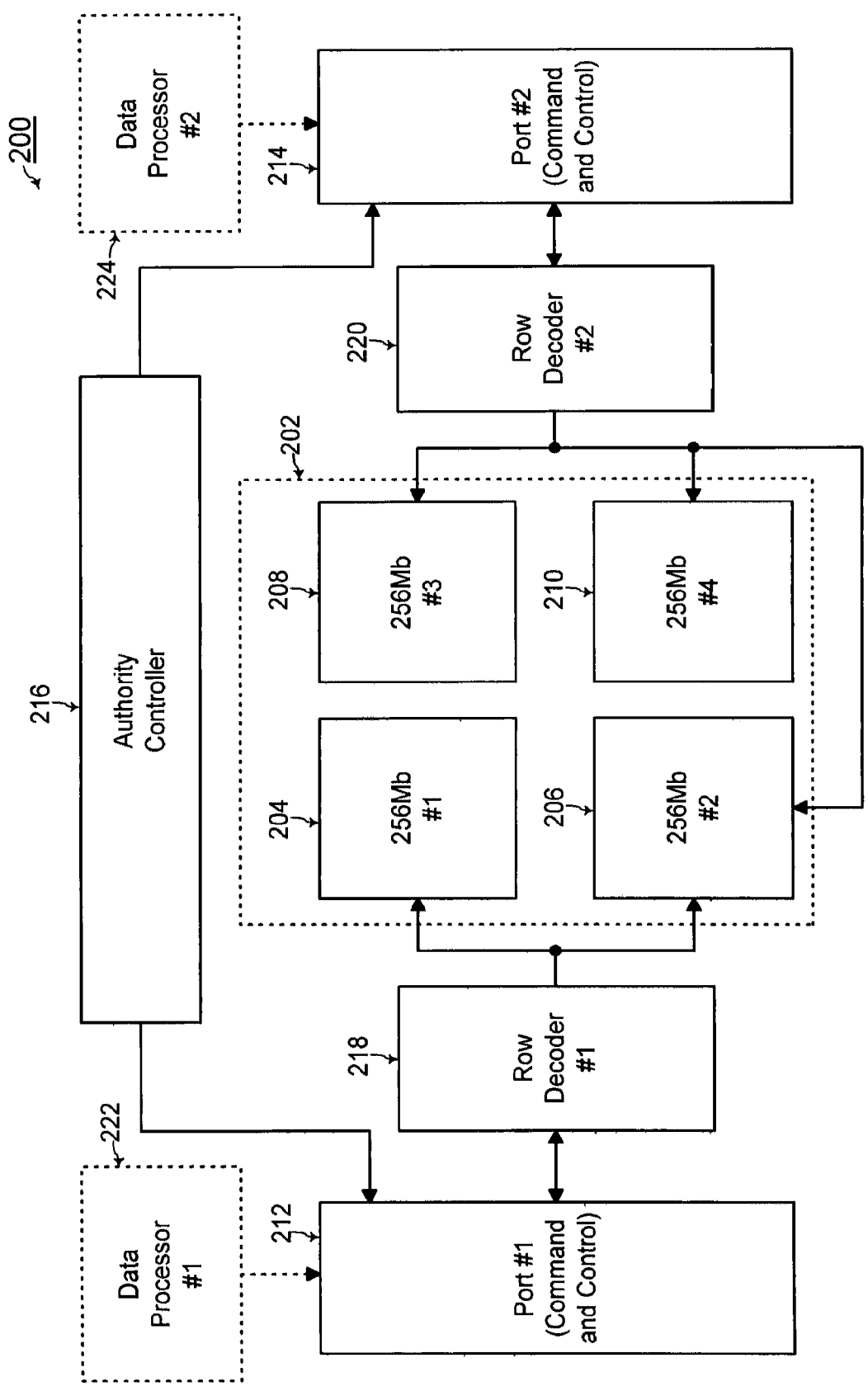
FIG. 3 shows a block diagram of a multi-port memory device with separate addressing schemes for first and second data processors accessing the memory device, according to an embodiment of the present invention.

FIG. 3 shows a block diagram of a multi-port semiconductor memory device 200 with flexible addressing according to an embodiment of the present invention. The multi-port semiconductor memory device 200 may be a multi-port DRAM (dynamic random access memory) device for example. The multi-port memory device 200 has shared access by a first data processor 222 and a second data processor 224. The data processors 222 and 224 are shown outlined in dashed lines in FIG. 3 as not being integral with the semiconductor memory device 200 in FIG. 3, according to an example embodiment of the present invention.

The multi-port memory device 200 includes a memory core 202 having an array of memory cells. For example, the memory core 202 has a capacity of 1.024 Gb (Giga-bits) with a first memory area 204, a second memory area 206, a third memory area 208, and a fourth memory area 210, each having a capacity of 256 Mb (Mega-bits).

The multi-port memory device 200 further includes a first port 212, a second port 214, an authority controller 216, a first row decoder 218, and a second row decoder 220. The first memory area 204 is assigned to the first port 212 by being dedicated for access just by the first data processor 222 via the first port 212. The third and fourth memory areas 208 and 210 are assigned to the second port 214 by being dedicated for access just by the second data processor 224 via the second port 214. The second memory area 206 has shared access by the first and second data processors 222 and 224 via the first and second ports 212 and 214, respectively.

The shared memory area 206 is organized into at least one shared memory unit such as at least one memory block according to an embodiment of the present invention. According to dual buffering technology, each memory block may independently be accessed by one of the ports 212 and 214 having port authority at any given time. Dual buffering technology in a multi-port memory device is generally and individually known to one of ordinary skill in the art.

The access controller 216 arbitrates access to each shared memory block in the shared memory area 206 between the ports 212 and 214. On the other hand, the first port 212 has access to its dedicated memory area, i.e., the first memory area 204, at any time. Similarly, the second port 214 has access to its dedicated memory areas, i.e., the third and fourth memory areas 208 and 210, at any time.

The first data processor 222 accesses the first memory area 204 and the second memory area 206 using first data addressing that is decoded by the first row decoder 218. The first row decoder 218 decodes a first row address from the first port 212 to determine a selected row of the memory core 202 being accessed by the first port 212. The second data processor 224 accesses the third and fourth memory areas 208 and 210 and the second memory area 206 using second data addressing that is decoded by the second row decoder 220. The second row decoder 220 decodes a second row address from the second port 214 to determine a selected row of the memory core 202 being accessed by the second port 214.

In one embodiment of the present invention, the first data addressing used by the first data processor 222 indicates a first memory capacity per memory bank, and the second data addressing used by the second data processor 224 indicates a second memory capacity per memory bank. Such different addressing used by the first and second data processors 222 and 224 provides more flexibility in organizing the memory core 202 for shared access among the first and second data processors 222 and 224.

Figure 4:
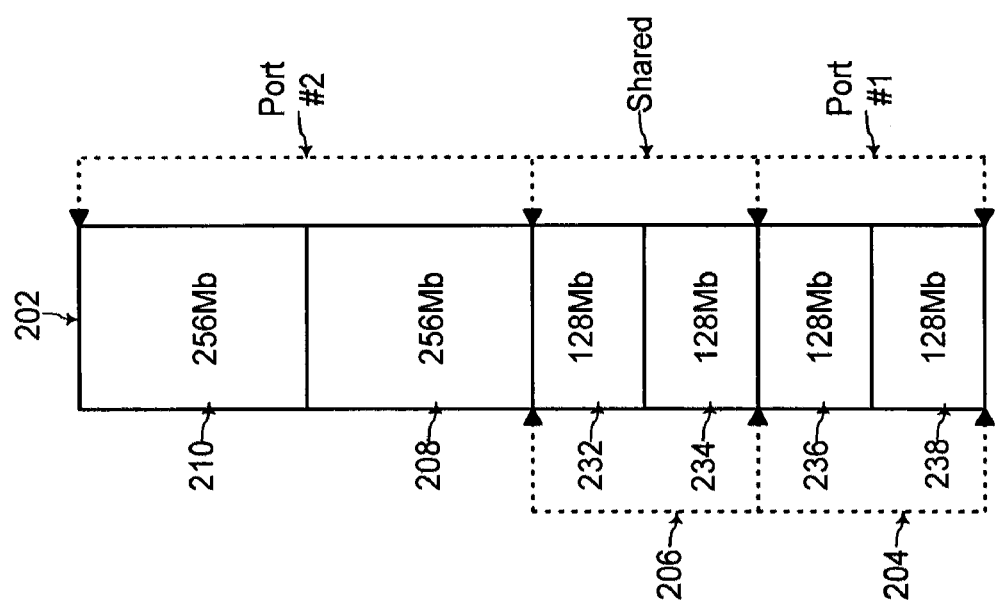

For example in FIG. 4, the second data addressing used by the second data processor 224 divides the first, second, third, and fourth 256 Mb memory areas 204, 206, 208, and 210 as respective memory banks. In addition, the second data addressing used by the second data processor 224 divides the shared 256 Mb memory area 206 into a first memory block 232 and a second memory block 234 each having 128 Mb memory capacity. Further in the example of FIG. 4, the first data addressing used by the first data processor 222 divides the first and second 256 Mb memory areas 204 and 206 into first, second, third, and fourth 128 Mb memory banks 232, 234, 236, and 238, respectively.

Figure 5:
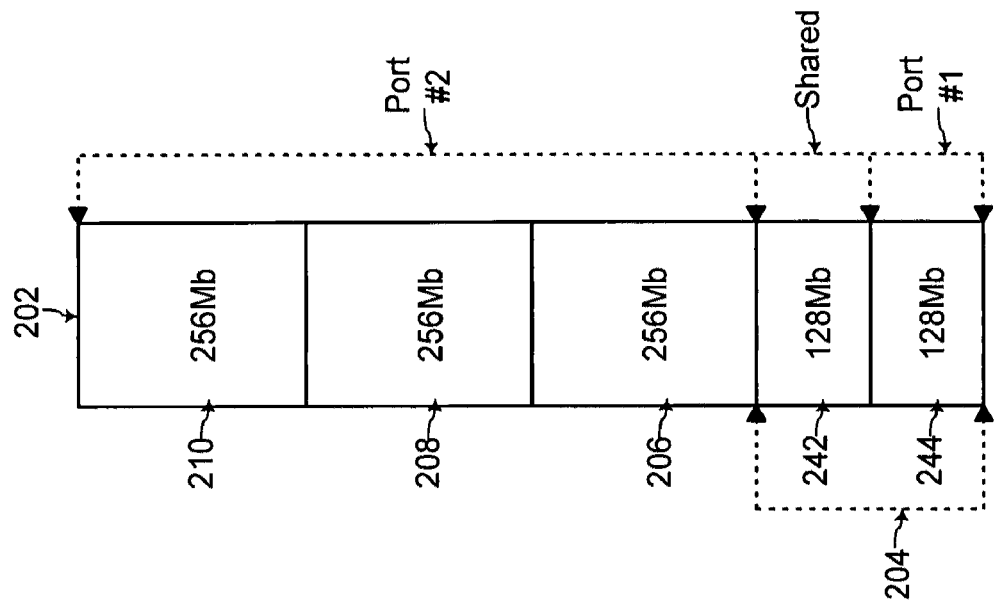
FIGS. 4, 5, and 6 illustrate configuration of a memory core of FIG. 3 with different addressing schemes for different memory capacity per bank for the multiple ports, according to an embodiment of the present invention.

In another example of FIG. 5, the second data addressing used by the second data processor 222 divides the first, second, third, and fourth 256 Mb memory areas 204, 206, 208, and 210 as respective memory banks. In addition in FIG. 5, a shared memory unit 242 is disposed within the first memory bank 204. Further in the example of FIG. 5, the first data addressing used by the first data processor 222 divides the first 256 Mb memory area into first and second 128 Mb memory banks 242 and 244, respectively, with the second memory bank 244 being dedicated to the second port 214.

Figure 6:
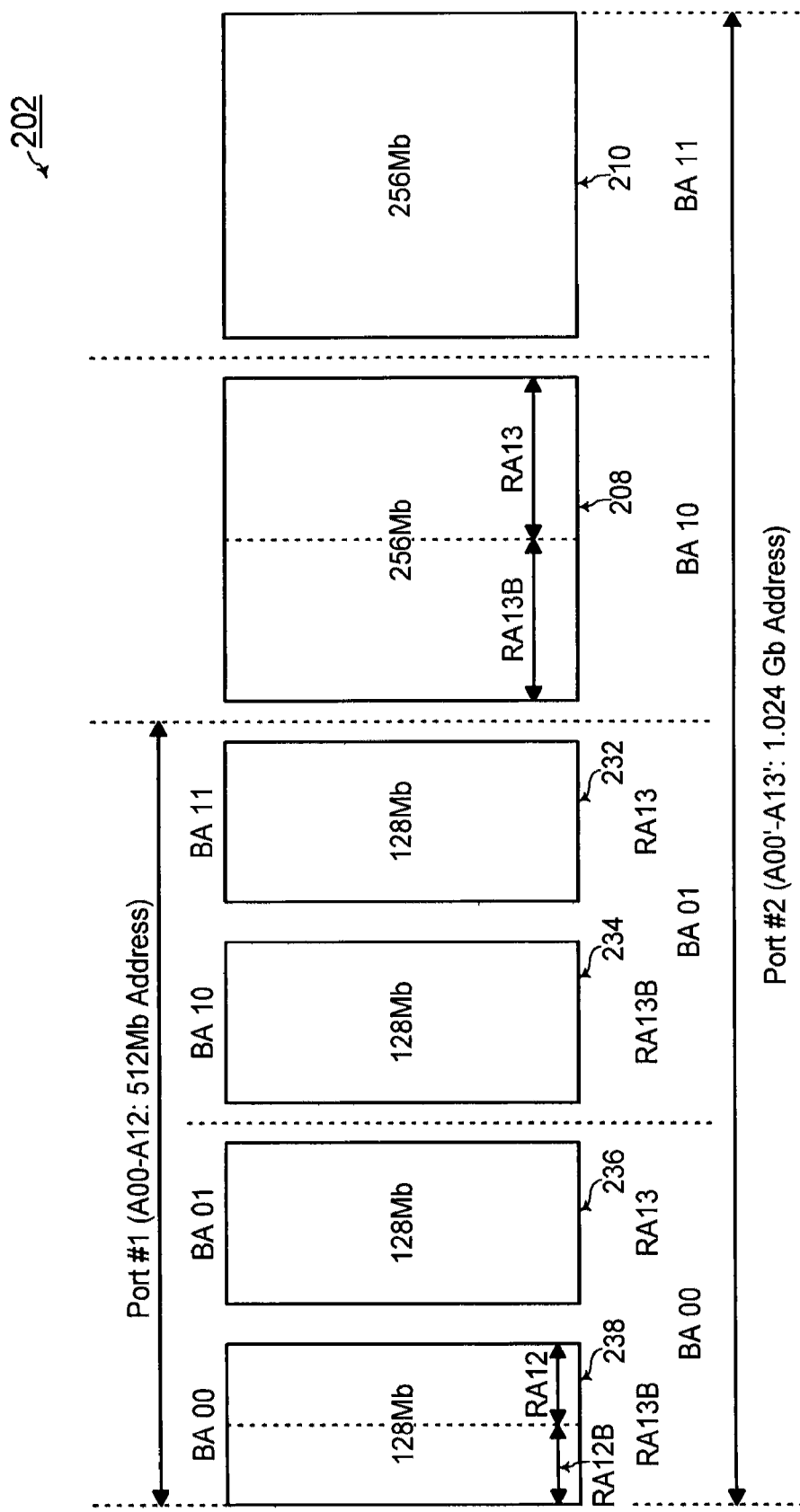

FIG. 6 further illustrates the different data addressing by the first and second data processors 222 and 224 as shown in FIG. 4. The first data addressing by the first data processor 222 uses thirteen address bits A00 through A12 for addressing a total of the 512 Mb memory capacity of the first and second memory areas 204 and 206. The first data addressing by the first data processor 222 divides the first and second memory areas 204 and 206 into four 128 Mb memory banks with respective bank addresses (BA00, BA01, BA10, and BA11). Then, a most significant row address bit RA12/RA12B indicates which half of a memory bank BA00 is being accessed by the first port 212.

Further in the example of FIG. 6, the second data addressing by the second data processor 224 uses fourteen address bits A00' through A13' for addressing a total of the 1.024 Gb memory capacity of the first, second, third, and fourth memory areas 204, 206, 208, and 210. The second data addressing by the second data processor 224 divides the first, second, third, and fourth memory areas 204, 206, 208, and 210 into four 256 Mb memory banks with respective bank addresses (BA00, BA01, BA10, and BA11). Then, a most significant row address bit RA13/RA13B indicates which half of such a memory bank BA00 is being accessed by the second port 214.

In this manner in FIG. 6, the first port 212 generates a respective bank address for specifying each of the 128 Mb shared memory blocks 232 and 234. On the other hand, the second port 214 generates both of a respective bank address and a respective row address for specifying each of the 128 Mb shared memory blocks 232 and 234.

In addition, the first port 212 accesses its dedicated memory area 204 and the shared memory blocks 232 and 234 using a first set of thirteen address bits A00-A12 that indicate a first memory size (or capacity) per bank (i.e., 128 Mb per bank). The first row decoder 218 decodes such a first set of address bits A00-A12 for determining a selected row of the memory core 202 to be accessed by the first port 212.

On the other hand, the second port 214 accesses its dedicated memory areas 208 and 210 and the shared memory blocks 232 and 234 with fourteen address bits A00'-A13' that indicate a second memory size (or capacity) per bank (i.e., 256 Mb per bank) that is different from the first memory size per bank. The first row decoder 220 decodes such a second set of address bits A00'-A13' for determining a selected row of the memory core 202 to be accessed by the second port 214.

Figure 7:
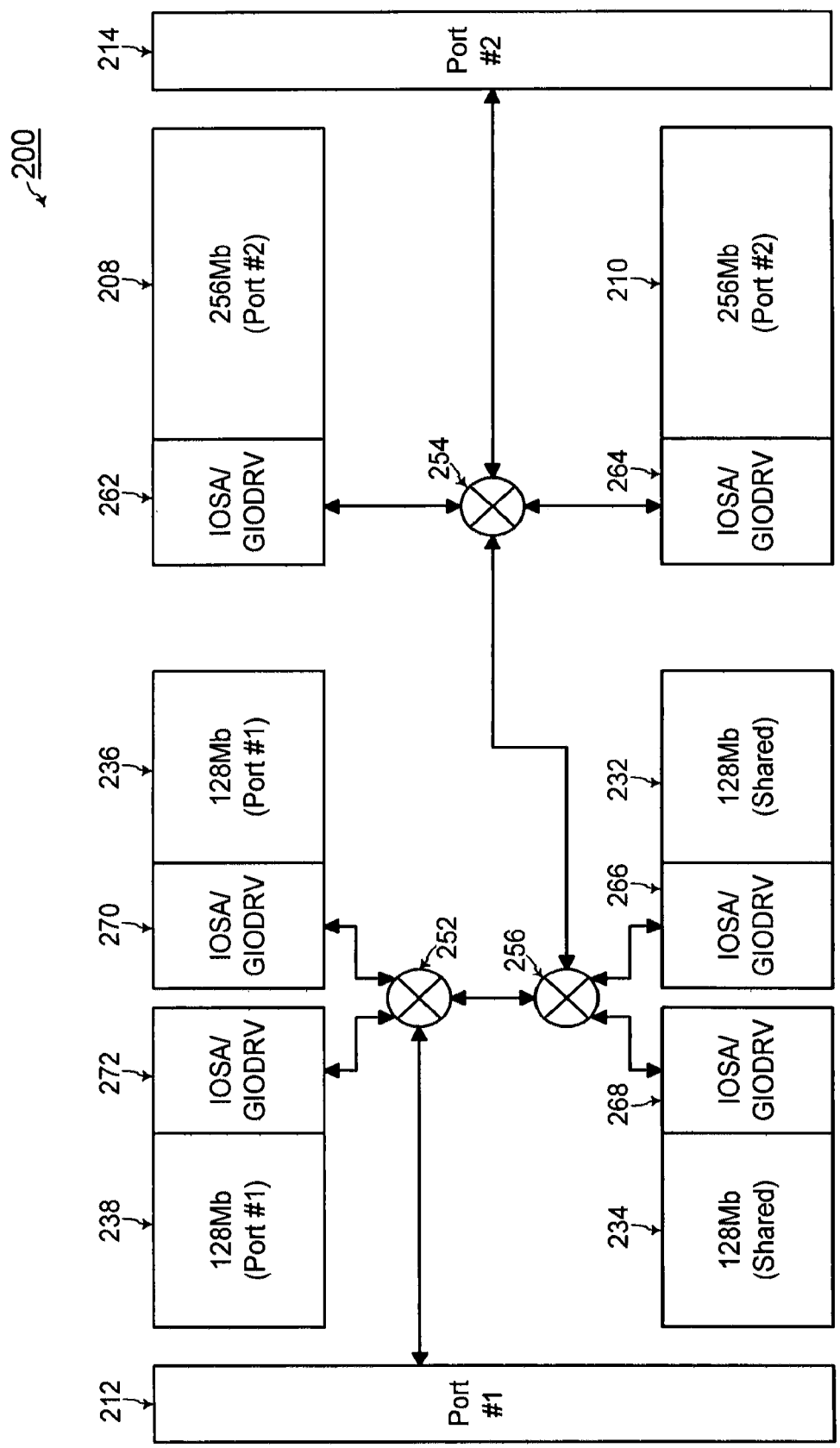
FIG. 7 shows a block diagram of a multi-port memory device with routing of access to a memory core with two levels of multiplexing, according to an embodiment of the present invention.

FIG. 7 shows a block diagram of the memory device 200 with routing of access to the memory areas 204, 206, 208, and 210 from the ports 212 and 214 with two levels of multiplexing. A first multiplexer 252 and a second multiplexer 254 form a first level of multiplexing, and a third multiplexer 256 forms a second level of multiplexing.

In FIG. 7, the memory units 208, 210, 232, 234, 236, and 238 have IOSA (input/output sense amplifier)/GIODRV (global input/output driver) units 262, 264, 266, 268, 270, and 272, respectively. Each IOSA/GIODRV unit includes a respective set of I/O sense amplifiers that are sensors for sensing signals from global I/O (input/output) lines of the respective one of the memory units 208, 210, 232, 234, 236, and 238. Each IOSA/GIODRV unit also includes a respective set of global I/O drivers that drive signals onto the global I/O lines of the respective one of the memory units 208, 210, 232, 234, 236, and 238.

Thus in FIG. 7, respective column select lines (CSLs), respective GIO (global input/output) lines, and a respective IOSA/GIODRV unit are fabricated for each of the memory units 208, 210, 232, 234, 236, and 238. CSLs, GIO lines, and IOSA/GIODRV units generally and individually are known to one of ordinary skill in the art.

The first multiplexer 252 is a respective multiplexer for the first port 212 and routes access from the first port 212 to the shared memory areas 232 and 234 or to the dedicated memory areas 236 and 238 depending on a row address for the access. The first multiplexer 252 routes access from the first port 212 to the third multiplexer 256 if the access from the first port 212 is to one of the shared memory areas 232 and 234. The first multiplexer 252 routes access from the first port 212 to one of the IOSA/GIODRV units 270 and 272 if the access is to one of the dedicated memory areas 236 and 238.

The second multiplexer 254 is a respective multiplexer for the second port 214 and routes access from the second port 214 to the shared memory areas 232 and 234 or to the dedicated memory areas 208 and 210 depending on a row address for the access. The second multiplexer 254 routes access from the second port 214 to the third multiplexer 256 if the access from the second port 214 is to one of the shared memory areas 232 and 234. The second multiplexer 254 routes access from the second port 214 to one of the IOSA/GIODRV units 262 and 264 if the access is to one of the dedicated memory areas 208 and 210.

The third multiplexer 256 is a shared multiplexer for the first and second ports 212 and 214 and routes access to one of the IOSA/GIODRV units 266 and 268 according to port authority between the first and second ports 212 and 214. The third multiplexer 256 is used when any of the ports 212 and 214 accesses any of the shared memory blocks 232 and 234 via the first and second multiplexers 252 and 254.

In FIG. 7, the shared memory units 232 and 234 are shared memory blocks that each may be accessed by a respective one of the first and second ports 212 and 214 having port authority at a given time according to dual buffering technology. Thus, each of the first and second memory blocks 232 and 234 has the respective CSLs, the respective GIO lines, and a respective IOSA/GIODRV unit fabricated for allowing independent access to each of the first and second memory blocks 232 and 234 by a respective one of the first and second ports 212 and 214 having port authority at a given time according to dual buffering technology.

Figure 8:
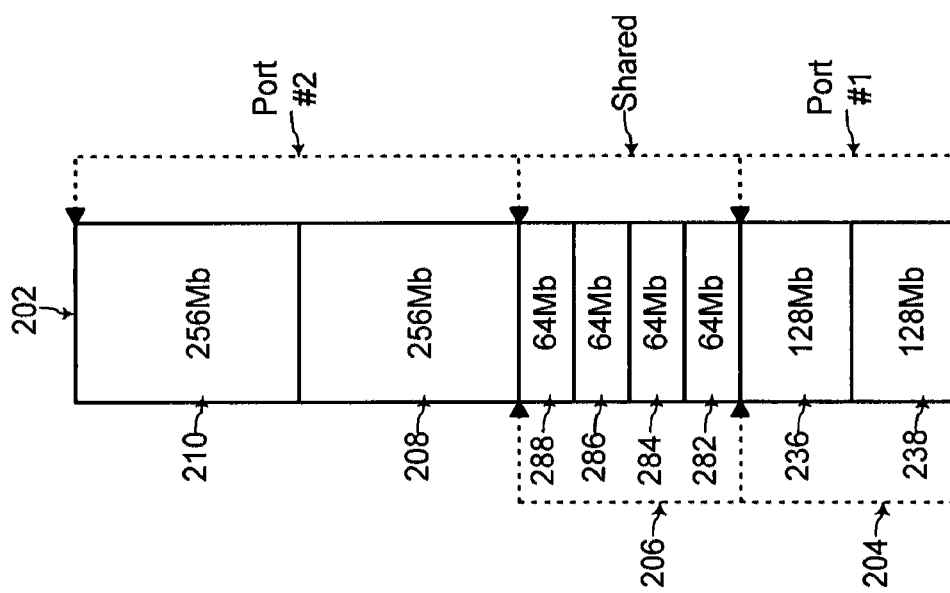
FIG. 8 illustrates another configuration of the memory core of FIG. 7 with further division of a shared memory area, according to another embodiment of the present invention.

FIG. 8 shows the memory core 202 with the 256 Mb shared memory area 206 being divided into four 64 Mb memory blocks 282, 284, 286, and 288. In that case, each of the memory blocks 282, 284, 286, and 288 may independently be accessed by a respective one of the first and second ports 212 and 214 having port authority at a given time according to dual buffering technology.

Figure 9:
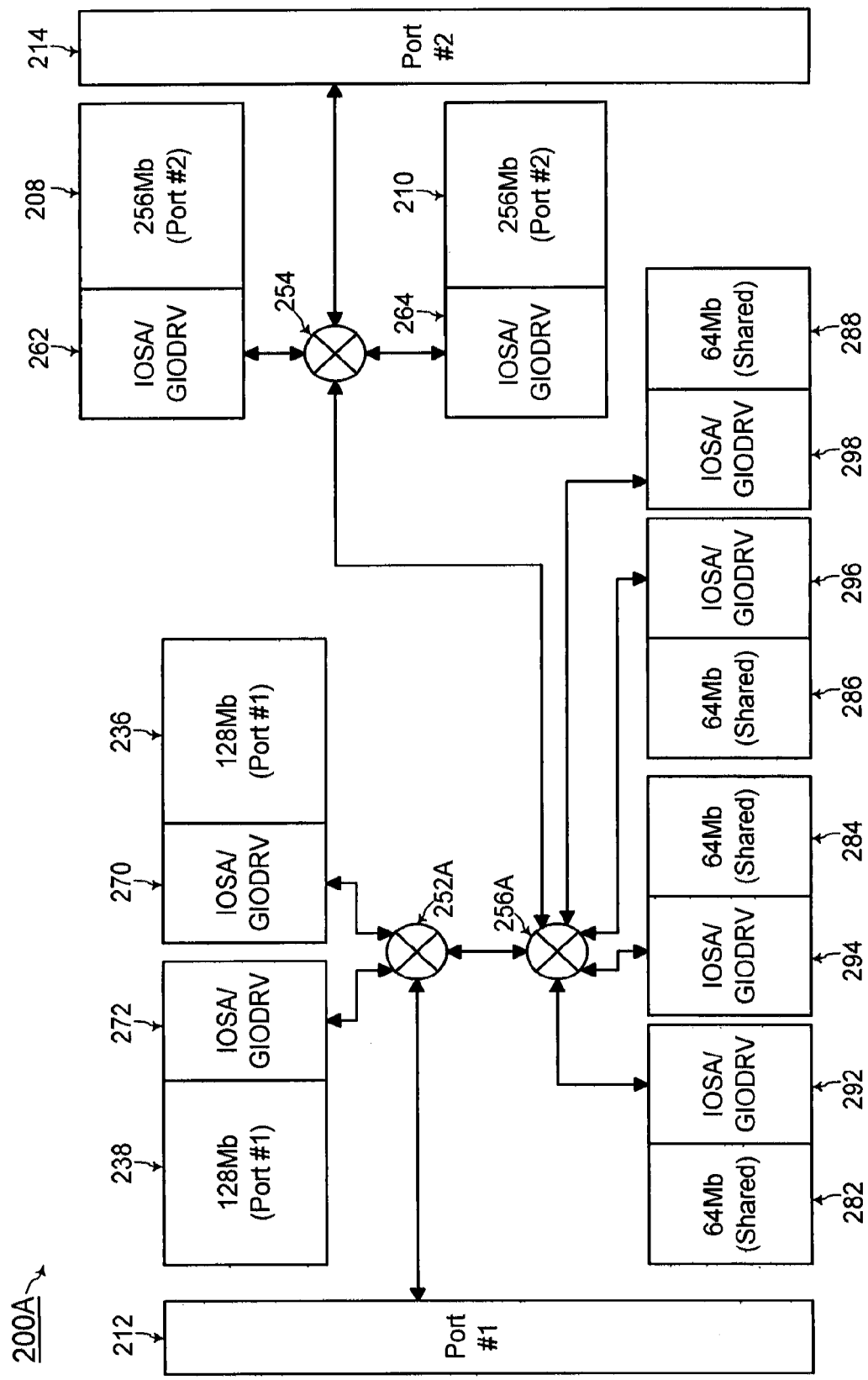
FIG. 9 shows a block diagram of a multi-port memory device with routing of access to the memory core of FIG. 8 with two levels of multiplexing, according to an embodiment of the present invention.

FIG. 9 shows a block diagram of a memory device 200A which may be the memory device 200 of FIG. 3 when the shared memory area 206 is organized into the four shared memory blocks 282, 284, 286, and 288 according to another embodiment of the present invention. FIG. 9 shows the memory device 200A with routing of access to the memory areas 208, 210, 236, 238, 282, 284, 286, and 288 from the ports 212 and 214 with two levels of multiplexers 252A, 254, and 256A. Elements having the same reference number in FIGS. 7 and 9 refer to elements having similar structure and/or function.

Referring to FIGS. 7 and 9, each of the memory blocks 282, 284, 286, and 288 has a respective set of CSLs, GIO lines, and an IOSA/GIODRV unit 292, 294, 296, or 298 fabricated for allowing independent access to each of the shared memory blocks 282, 284, 286, and 288 by a respective one of the first and second ports 212 and 214 having port authority at a given time according to dual buffering technology. In FIG. 9, the first multiplexer 252A is a respective multiplexer for the first port and routes access from the first port 212 to the shared memory blocks 282, 284, 286, and 288 or to the dedicated memory areas 236 and 238 depending on a row address for the access.

In FIG. 9, the first multiplexer 252A routes access from the first port 212 to the third multiplexer 256A if the access from the first port 212 is to one of the shared memory blocks 282, 284, 286, and 288. Alternatively, the first multiplexer 252A routes access from the first port 212 to one of the IOSA/GIODRV units 270 and 272 if the access is to one of the dedicated memory areas 236 and 238.

Further in FIG. 9, the second multiplexer 254 is a respective multiplexer for the second port and routes access from the second port 214 to the shared memory blocks 282, 284, 286, and 288 or to the dedicated memory areas 208 and 210 depending on a row address for the access. The second multiplexer 254 routes access from the second port 214 to the third multiplexer 256A if the access from the second port 214 is to one of the shared memory blocks 282, 284, 286, and 288.

Alternatively, the second multiplexer 254 routes access from the second port 214 to one of the IOSA/GIODRV units 262 and 264 if the access is to one of the dedicated memory areas 208 and 210. Also in FIG. 9, the third multiplexer 256A is a shared multiplexer between the first and second ports 212 and 214 and routes access to one of the IOSA/GIODRV units 292, 294, 296, and 298 according to port authority. The shared multiplexer 256A is used when any of the ports 212 and 214 having port authority accesses any of the shared memory blocks 282, 284, 286, and 288 via the first and second multiplexers 252A and 254.

The two levels of multiplexing in FIG. 7 or 9 require a large area for bus lines running between the multiplexers 252, 254, and 256 in FIG. 7 or between the multiplexers 252A, 254, and 256B in FIG. 9. Such area for the bus lines increases with the number of shared memory blocks in the shared memory area 206. In addition, the relatively high number of multiplexers used for such two levels of multiplexing also occupies a large area. Furthermore, in FIG. 7 or 9, a respective separate IOSA/GIODRV unit is fabricated for each of the shared memory blocks 232, 234, 282, 284, 286, and 288 further adding area. Thus, the integrated circuit for the semiconductor memory device 200 or 200A in FIG. 7 or 9 may undesirably have a large area.

Figure 10:
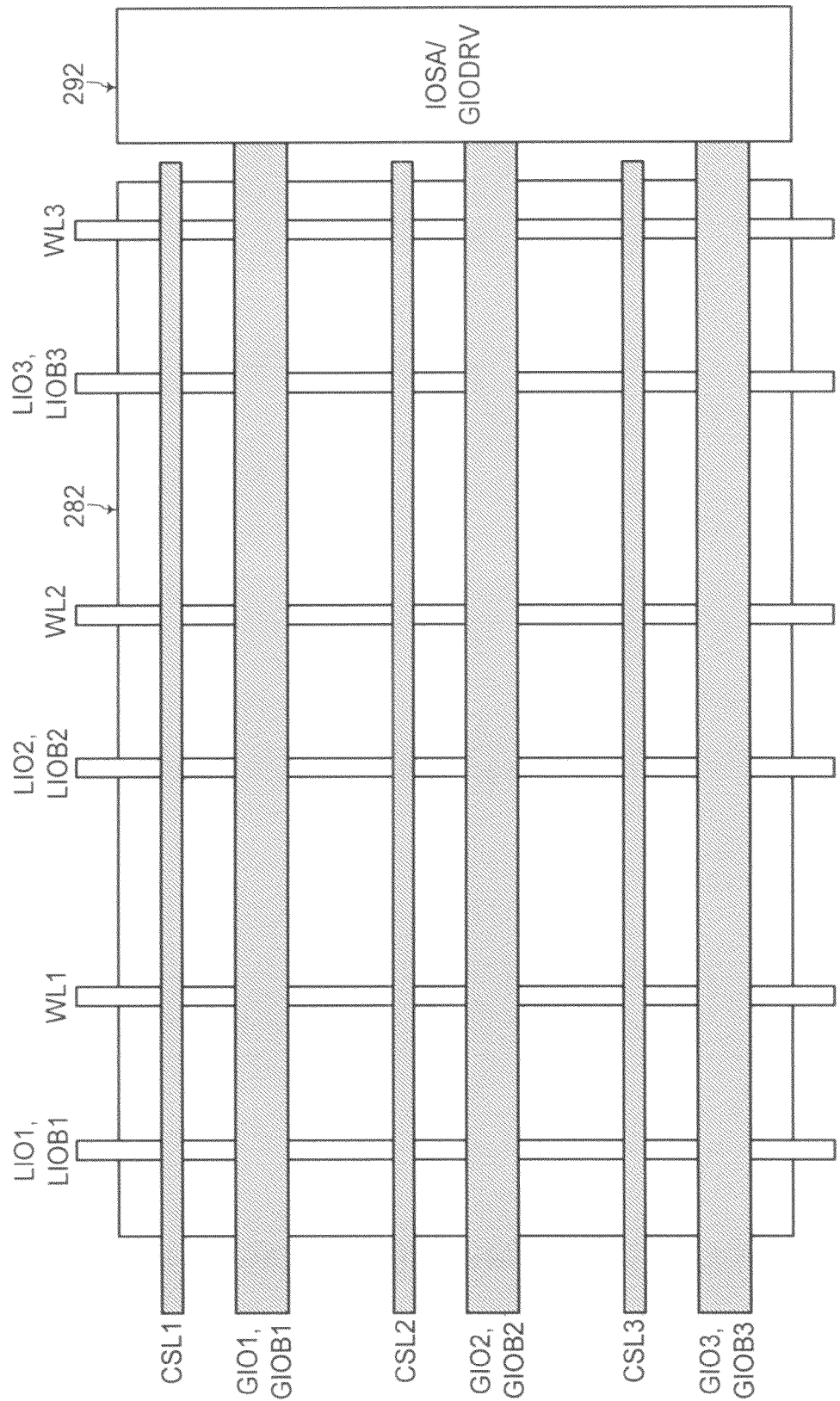
FIG. 10 shows an example lay-out of signal lines for a memory block.

FIG. 10 shows a lay-out of signal lines fabricated for one of the memory areas 208, 210, 232, 234, 236, and 238 of FIG. 7 or one of the memory areas 208, 210, 236, 238, 282, 284, 286, and 288 of FIG. 9. For example, FIG. 10 illustrates the example for the shared memory block 282 of FIG. 9. Referring to FIG. 10, the example shared memory block 282 includes a plurality of word lines WL1, WL2, and WL3 and a plurality of column select lines CSL1, CSL2, and CSL3 that are activated by a row decoder and a column decoder, respectively, for accessing a selected memory cell in the memory core 202.

In addition, the example shared memory block 282 includes a plurality of local I/O lines LIO1/LIOB1, L102/LIOB2, and LIO3/LIOB3 and a plurality of global I/O lines GIO1/GIOB1, GIO2/GIOB2, and GIO3/GIOB3 used for further accessing the selected memory cell. The signal lines of FIG. 10 in general and individually are known to one of ordinary skill in the art. In the example of FIG. 10, the plurality of word lines WL1, WL2, and WL3 and the plurality of local I/O lines LIO1/LIOB1, LIO2/LIOB2, and LIO3/LIOB3 are fabricated on a lower interconnect level. In addition, the plurality of column select lines CSL1, CSL2, and CSL 3 and the plurality of global I/O lines GIO1/GIOB1, GIO2/GIOB2, and GIO3/GIOB3 are fabricated on a higher interconnect level.

Each of the interconnect lines for the local and global I/O lines LIO1/LIOB1, LIO2/LIOB2, and LIO3/LIOB3 and GIO1/GIOB1, GIO2/GIOB2, and GIO3/GIOB3 represent a complementary pair of signal lines for differential signal transmission. However, just one signal line is illustrated for such pair of differential signal lines in FIG. 10 for simplicity of illustration. Also in the example of FIG. 10, the local I/O lines and the word lines are typically formed along a row of memory cells in the memory core 202. In contrast, the global I/O lines and the column select lines are formed along a column of memory cells in the memory core.

Further referring to FIG. 10, the plurality of global I/O lines GIO1/GIOB1, GIO2/GIOB2, and GIO3/GIOB3 is connected to the respective IOSA/GIODRV unit 292 fabricated for the example shared memory block 282. In FIGS. 7 and 9, a respective separate IOSA/GIODRV unit is fabricated for each of the shared memory blocks 232, 234, 282, 284, 286, and 288. In addition, a respective set of signals lines LIO/LIOB, GIO/GIOB, WLs (word lines), and CSLs is fabricated for each of the shared memory blocks 232, 234, 282, 284, 286, and 288.

Figure 11:
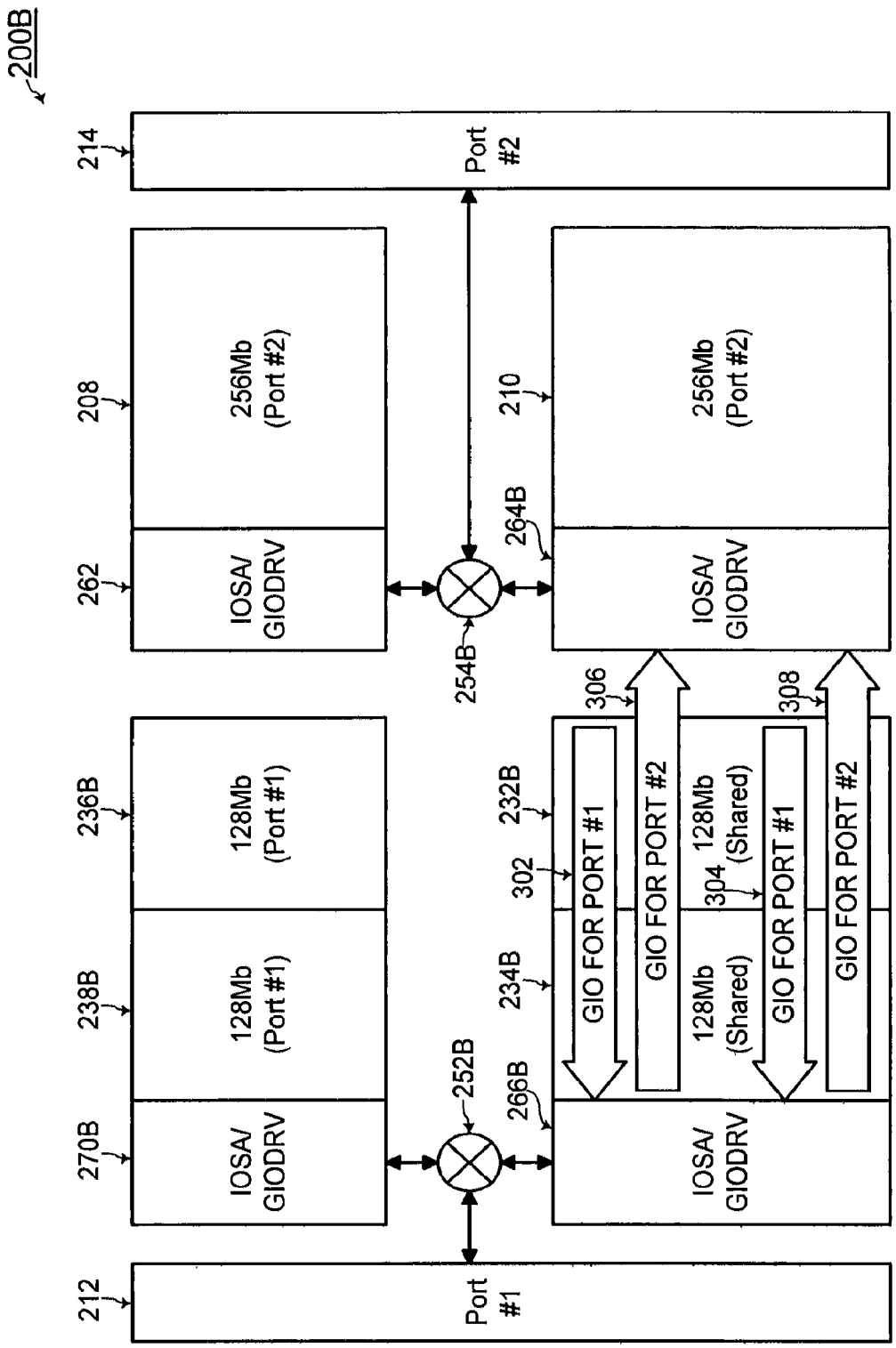
FIG. 11 shows a block diagram of a multi-port memory device with routing of access to a memory core with one level of multiplexing, according to an embodiment of the present invention.

FIG. 11 shows a block diagram of a memory device 200B which may be the memory device 200 of FIG. 3 when the shared memory area 206 is organized into two shared memory blocks 232B and 234B according to another embodiment of the present invention. In addition, the memory device 200B has one level of multiplexing with first and second multiplexers 252B and 254B for routing access to the memory core 202 by the first and second ports 212 and 214.

Referring to FIG. 11, just one IOSA/GIODRV unit 270B is fabricated for the memory areas 236B and 238B dedicated to the first port 212. In addition, one set of global I/O (GIO/GIOB) lines are fabricated through the dedicated memory areas 236B and 238B. Also in FIG. 11, the memory areas 208 and 210 have IOSA/GIODRV units 262 and 264B, respectively, fabricated for access to the dedicated memory areas 208 and 210 by the second port 214. Further in FIG. 11, just one IOSA/GIODRV unit 266B is fabricated for access to the shared memory blocks 232B and 234B by the first port 212. The IOSA/GIODRV unit 264B is also used by the second port 214 for accessing the shared memory blocks 232B and 234B.

The first multiplexer 252B routes access from the first port 212 to the IOSA/GIODRV unit 270B if the access from the first port 212 is to the dedicated memory areas 236B and 238B. Alternatively, the first multiplexer 252B routes access from the first port 212 to the IOSA/GIODRV unit 266B if the access from the first port 212 is to any of the shared memory blocks 232B and 234B.

The second multiplexer 254B routes access from the second port 214 to one of the IOSA/GIODRV units 262 or 264B if the access from the second port 214 is to one of the dedicated memory areas 208 and 210. Alternatively, the second multiplexer 254B routes access from the second port 214 to the IOSA/GIODRV unit 264B if the access from the second port 214 is to any of the shared memory blocks 232B and 234B.

Note that in the example of FIG. 11, the IOSA/GIODRV unit 264B is shared for access by second port 214 to the dedicated area 210 and to the shared memory blocks 232B and 234B. However, the present invention may also be practiced when two separate IOSA/GIODRV units are fabricated with one being used for access by the second port 214 to the dedicated area 210 and another being used for access by the second port 214 to the shared memory blocks 232B and 234B.

Further referring to FIG. 11, a first set of global I/O lines (GIO/GIOB) 302 and 304 are formed through the shared memory blocks 232B and 234B for access by the first port 212. In addition, a second set of global I/O lines (GIO/GIOB) 306 and 308 are formed through the shared memory blocks 232B and 234B for access by the second port 214. The first set of global I/O lines 302 and 304 are sensed or driven by the IOSA/DRV unit 266B for access by the first port 212 to any of the shared memory blocks 232B and 234B. The second set of global I/O lines 306 and 308 are sensed or driven by the IOSA/DRV unit 264B for access by the second port 214 to any of the shared memory blocks 232B and 234B.

Figure 12:
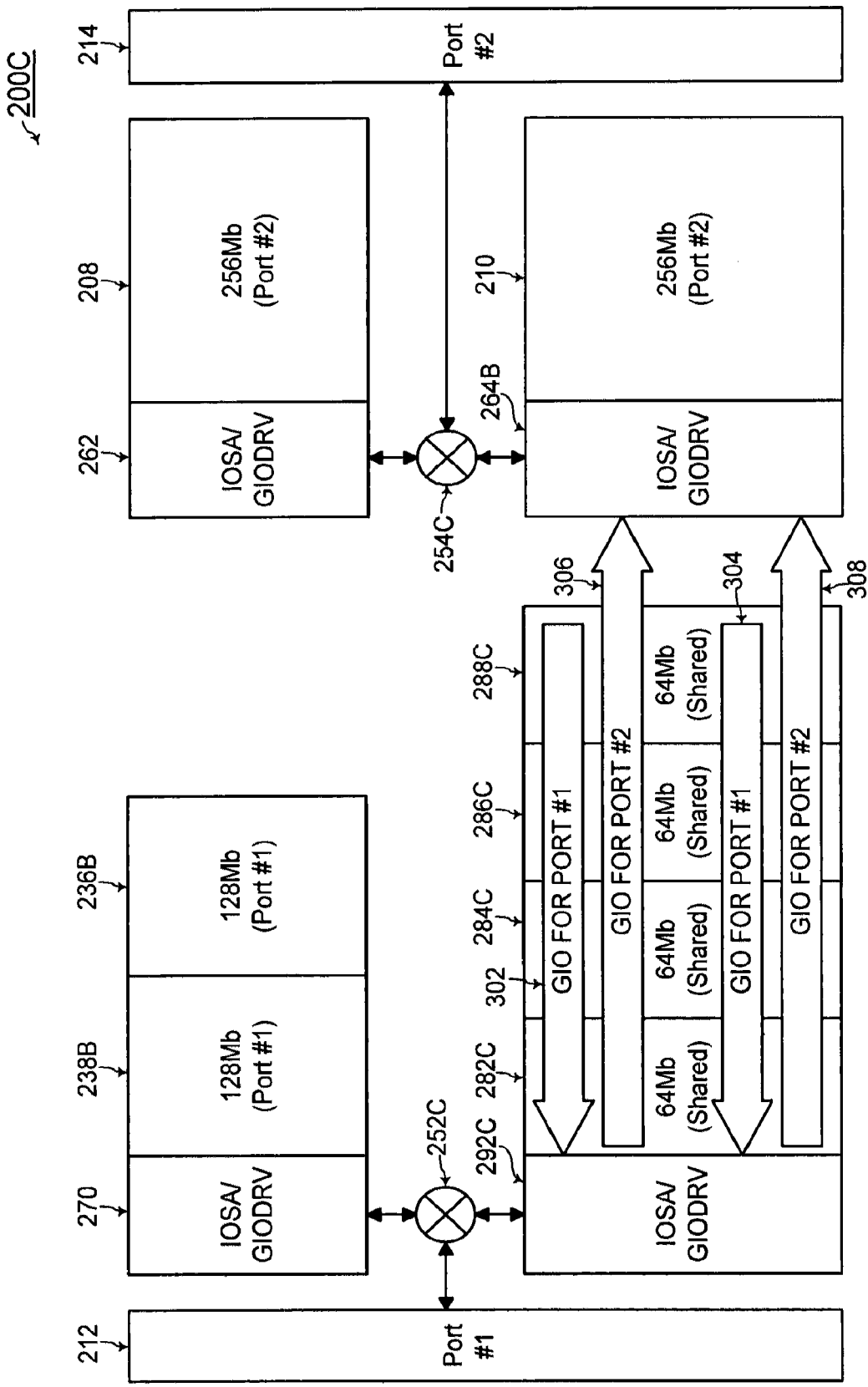
FIG. 12 shows a block diagram of a multi-port memory device with routing of access to the memory core of FIG. 8 with one level of multiplexing, according to another embodiment of the present invention.

FIG. 12 shows a block diagram of a memory device 200C which may be the memory device 200 of FIG. 3 when the shared memory area 206 is organized into four shared memory blocks 282C, 284C, 286C, and 288C according to another embodiment of the present invention. In addition, the memory device 200C has one level of multiplexing with first and second multiplexers 252C and 254C for routing access to the memory core 202 by the first and second ports 212 and 214. Elements having the reference number in FIGS. 11 and 12 have similar structure/function.

In FIG. 12, just one IOSA/GIODRV unit 292C is fabricated for access to the shared memory blocks 282C, 284C, 286C, and 288C by the first port 212. The IOSA/GIODRV unit 264B is used by the second port 214 for accessing the shared memory blocks 282C, 284C, 286C, and 288C.

Further in FIG. 12, the first multiplexer 252C routes access from the first port 212 to the IOSA/GIODRV unit 270B if the access from the first port 212 is to the dedicated memory areas 236B and 238B. Alternatively, the first multiplexer 252C routes access from the first port 212 to the IOSA/GIODRV unit 292C if the access from the first port 212 is to any of the shared memory blocks 282C, 284C, 286C, and 288C.

The second multiplexer 254C routes access from the second port 214 to one of the IOSA/GIODRV units 262 or 264B if the access from the second port 214 is to one of the dedicated memory areas 208 and 210. Alternatively, the second multiplexer 254B routes access from the second port 214 to the IOSA/GIODRV unit 264B if the access from the second port 214 is to any of the shared memory blocks 282C, 284C, 286C, and 288C.

Note that in the example of FIG. 12, the IOSA/GIODRV unit 264B is shared for access by the second port 214 to the dedicated area 210 and to the shared memory blocks 282C, 284C, 286C, and 288C. However, the present invention may also be practiced when two separate IOSA/GIODRV units are fabricated with one being used for access by second port 214 to the dedicated area 210 and another being used for access by the second port 214 to the shared memory blocks 282C, 284C, 286C, and 288C.

Further referring to FIG. 12, the first set of global I/O lines (GIO/GIOB) 302 and 304 are formed through the shared memory blocks 282C, 284C, 286C, and 288C for access by the first port 212. In addition, a second set of global I/O lines (GIO/GIOB) 306 and 308 are formed through the shared memory blocks 282C, 284C, 286C, and 288C for access by the second port 214.

The first set of global I/O lines 302 and 304 are sensed or driven by the IOSA/DRV unit 292C for access by the first port 212 to any of the shared memory blocks 282C, 284C, 286C, and 288C. The second set of global I/O lines 306 and 308 are sensed or driven by the IOSA/DRV unit 264B for access by the second port 214 to any of the shared memory blocks 282C, 284C, 286C, and 288C.

Figure 13:
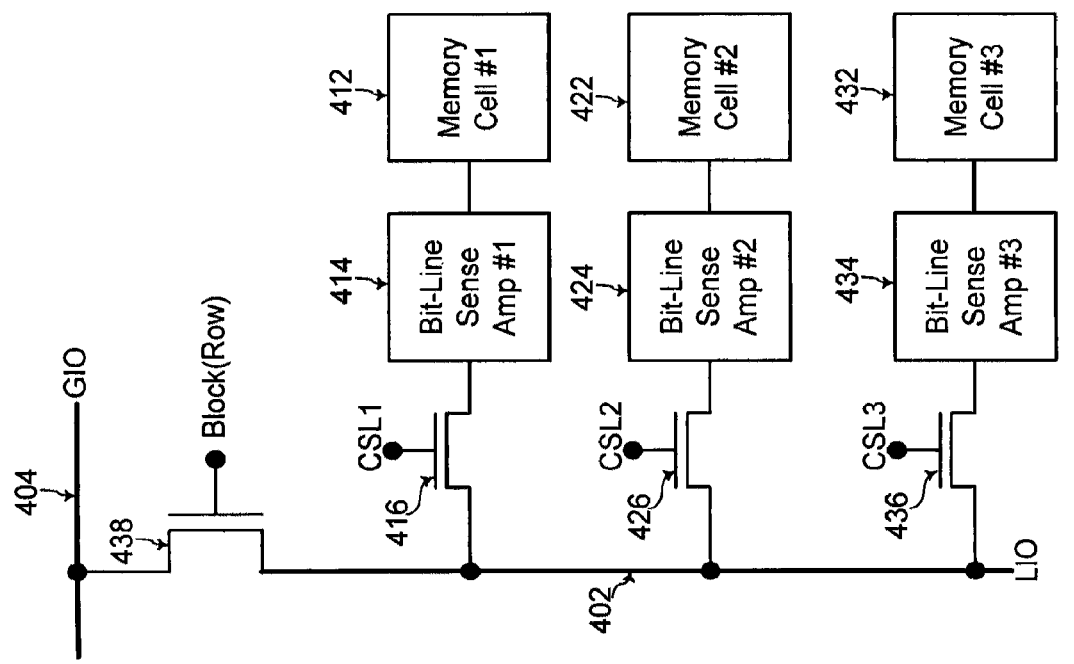
FIG. 13 shows a circuit and block diagram of memory cells coupled to signal lines in the memory core of FIG. 7, according to an embodiment of the present invention.

In FIG. 11 or 12, local multiplexing occurs within the shared memory blocks of the shared memory area 206 for selecting a coupling of a local I/O line between the first set of global I/O lines 302 and 304 for the first port 212 and the second set of global I/O lines 306 and 308 for the second port 214 according to port authority. FIG. 13 shows a local I/O line 402 and a global I/O line 404 for example in the shared memory block 234 of FIG. 7.

Further in FIG. 13, a first memory cell 412 is coupled to the local I/O line 402 through a first bit-line sense amplifier 414 and a first column select field effect transistor 416. In addition, a second memory cell 422 is coupled to the local I/O line 402 through a second bit-line sense amplifier 424 and a second column select field effect transistor 426. Furthermore, a third memory cell 432 is coupled to the local I/O line 402 through a third bit-line sense amplifier 434 and a third column select field effect transistor 436.

The column select field effect transistors 416, 426, and 436 have gates with column select signals CSL1, CSL2, and CSL3, respectively, applied thereon. In FIG. 13, the memory cells 412, 422, and 432 are from a row in the memory core 202, and one of the column select signals CSL1, CSL2, and CSL3 is activated for coupling the bit-line of a respective one of the memory cells 412, 422, and 432 to the local I/O line 402.

Also in FIG. 13, a row select field effect transistor 438 is coupled between the local I/O line 402 and the global I/O line 404 and is turned on with a row select signal for connecting the local I/O line 402 to the global I/O line 404. When a memory cell to be accessed is in a row of memory cells coupled to the local I/O line 402, the row select signal (as generated by one of the row decoders 218 and 220) applied on the gate of the field effect transistor 438 is activated for coupling the local I/O line 402 to the global I/O line 404.

Figure 14:
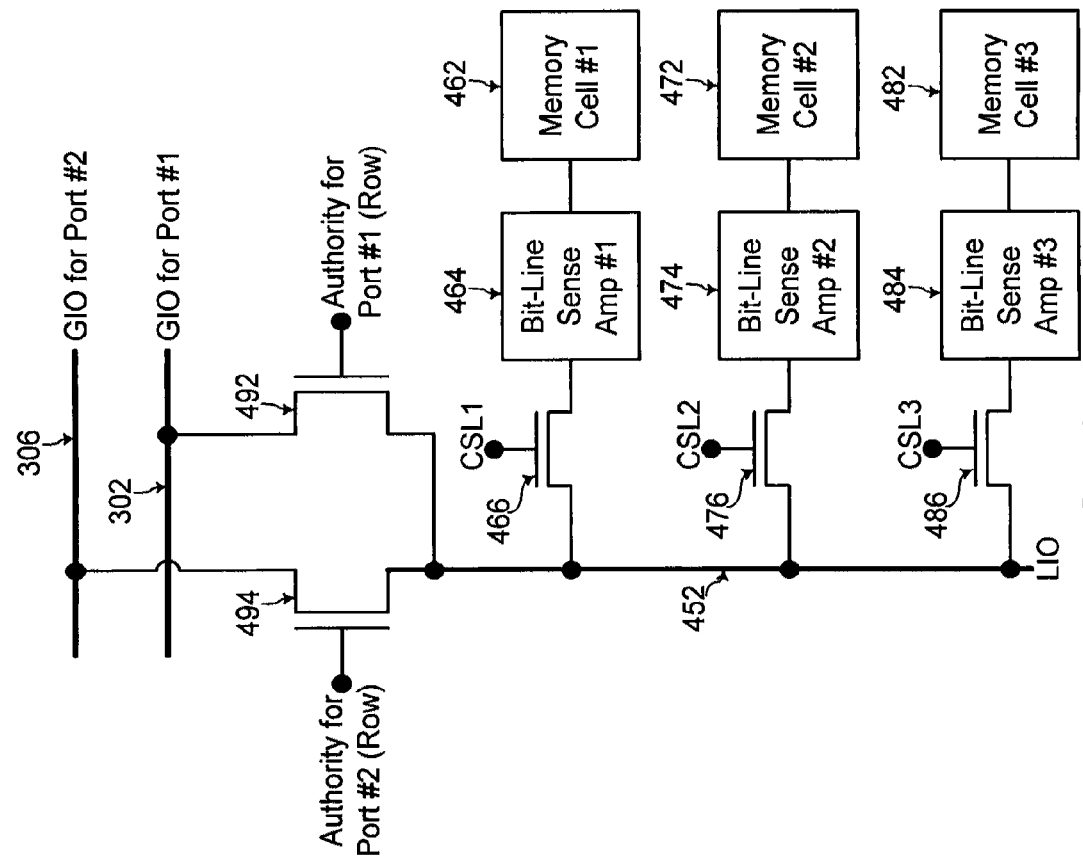
FIG. 14 shows a circuit and block diagram of memory cells coupled to signal lines in the memory core of FIG. 11, according to an embodiment of the present invention.

FIG. 14 shows a local I/O line 452, a global I/O line 302 for the first port 212, and a global I/O line 306 for the second port 214 in one of the shared memory blocks 232B and 234B of FIG. 11 or 282C, 284C, 286C, and 288C of FIG. 12. Further in FIG. 14, a first memory cell 462 is coupled to the local I/O line 452 through a first bit-line sense amplifier 464 and a first column select field effect transistor 466. In addition, a second memory cell 472 is coupled to the local I/O line 452 through a second bit-line sense amplifier 474 and a second column select field effect transistor 476. Furthermore, a third memory cell 482 is coupled to the local I/O line 452 through a third bit-line sense amplifier 484 and a third column select field effect transistor 486.

Also in FIG. 14, the column select field effect transistors 466, 476, and 486 have gates with column select signals CSL1, CSL2, and CSL3, respectively, applied thereon. In FIG. 14, the memory cells 462, 472, and 482 are from a row in the memory core 202, and one of the column select signals CSL1, CSL2, and CSL3 is activated for coupling the bit-line of a respective one of the memory cells 462, 472, and 482 to the local I/O line 452.

Further in FIG. 14, a first multiplexing field effect transistor 492 is coupled between the global I/O line 302 for the first port 212 and the local I/O line 452. Additionally, a second multiplexing field effect transistor 494 is coupled between the global I/O line 306 for the second port 214 and the local I/O line 452.

The signal applied on a gate of the first multiplexing field effect transistor 492 is activated while the signal on a gate of the second multiplexing field effect transistor 494 is deactivated when the first port 212 has port authority for access to the shared memory block with the local I/O line 452. In that case, the first multiplexing field effect transistor 492 is turned on, and the second multiplexing field effect transistor 494 is turned off, such that the global I/O line 302 for the first port 212 (instead of the global I/O line 306 for the second port 214) is connected to the local I/O line 452.

Alternatively, the signal applied on the gate of the first multiplexing field effect transistor 492 is deactivated while the signal on the gate of the second multiplexing field effect transistor 494 is activated when the second port 214 has port authority for access to the shared memory block with the local I/O line 452. In that case, the first multiplexing field effect transistor 492 is turned off, and the second multiplexing field effect transistor 494 is turned on, such that the global I/O line 306 for the second port 214 (instead of the global I/O line 302 for the first port 212) is connected to the local I/O line 452.

A respective set of such multiplexing field effect transistors 492 and 494 form a respective local multiplexer coupled between each local I/O line and the global I/O lines for the first and second ports 212 and 214. Such a local multiplexer connects the local I/O line to a selected one of the global I/O lines for the first and second ports 212 and 214 according to port authority that indicates which one of the ports 212 and 214 has access to the shared memory block with that local I/O line.

In FIGS. 11 and 12, the number of IOSA/GIODRV units is reduced from those in FIGS. 7 and 9, respectively. In addition, the number of multiplexers in FIGS. 11 and 12 are reduced from those in FIGS. 7 and 9. Furthermore, with the single level of multiplexers in FIGS. 11 and 12, the bus lines between the multiple levels of multiplexers in FIGS. 7 and 9 are also eliminated. Such bus lines which are formed apart from the array of memory cells of the shared memory blocks occupy a relatively large area in FIGS. 7 and 9.

The multiplexing field effect transistors 492 and 494 in FIG. 14 and the first and second set of global I/O lines 302, 304, 306, and 308 in FIGS. 11 and 12 are formed as part of the array of memory cells of the shared memory blocks. Thus, such components 492 and 494 and 302, 304, 306, and 308 formed as part of the array of memory cells of the shared memory blocks do not significantly add to the area of the shared memory blocks. Thus, the integrated circuit area for each of the memory devices 200B and 200C is advantageously reduced.

Figure 15:
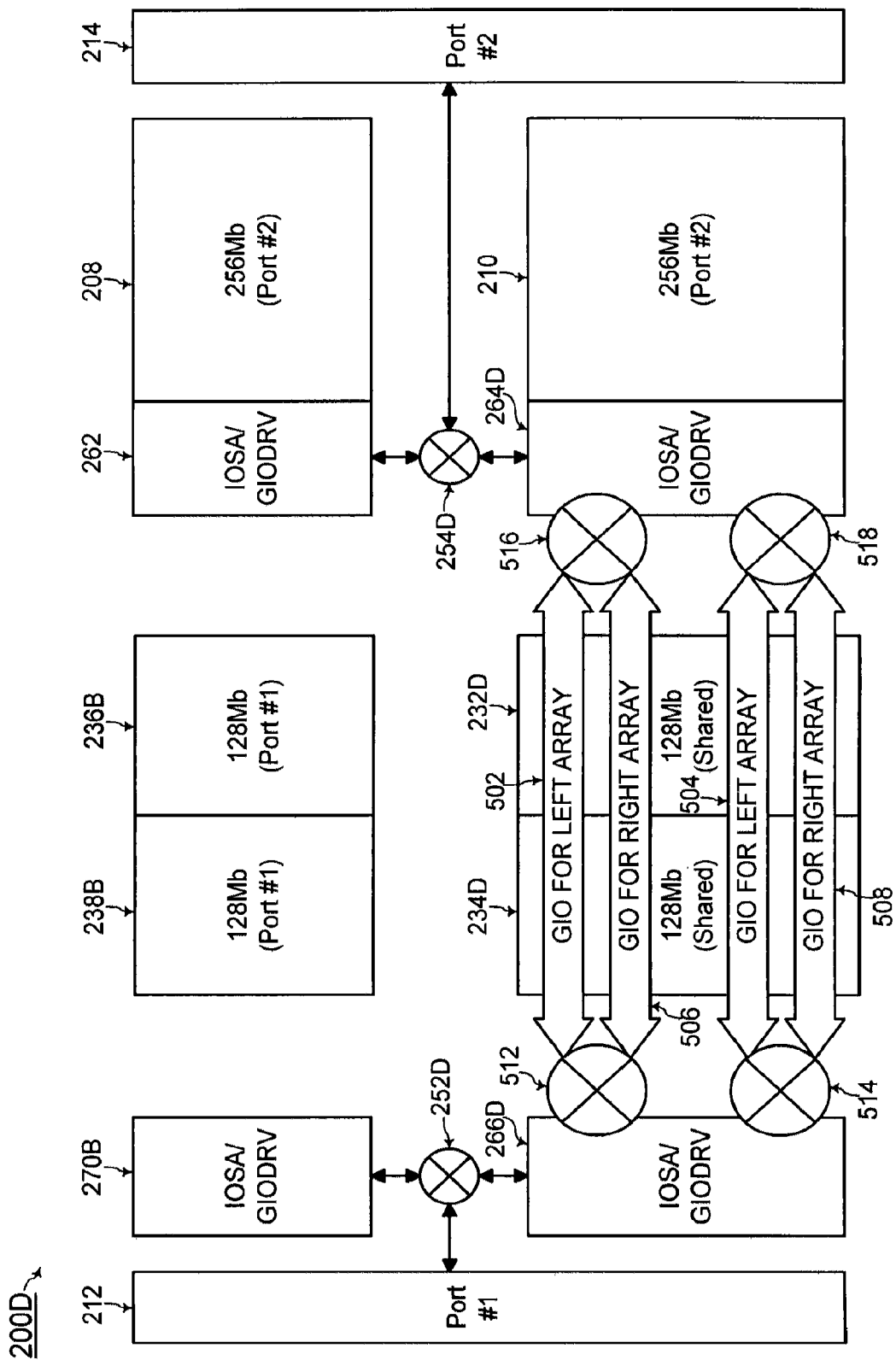
FIG. 15 shows a block diagram of a multi-port memory device with routing of access to a memory core according to arrays of the memory core with one level of multiplexing, according to another embodiment of the present invention.

FIG. 15 shows a block diagram of a memory device 200D which may be the memory device 200 of FIG. 3 when the shared memory area 206 is organized into two shared memory blocks 232D and 234D according to another embodiment of the present invention. In addition, the memory device 200D has one level of multiplexing with first and second multiplexers 252D and 254D for routing access to the memory core 202 by the first and second ports 212 and 214. Elements having the same reference number in FIGS. 11 and 15 refer to elements having similar structure and/or function.

Referring to FIG. 15, just one IOSA/GIODRV unit 266D is fabricated for access to the shared memory blocks 232D and 234D by the first port 212. An IOSA/GIODRV unit 264D is used by the second port 214 for accessing the shared memory blocks 232D and 234D. The IOSA/GIODRV unit 264D is also used by the second port 214 for accessing the dedicated memory area 210.

The first multiplexer 252D routes access from the first port 212 to the IOSA/GIODRV unit 270B if the access from the first port 212 is to the dedicated memory areas 236B and 238B. Alternatively, the first multiplexer 252D routes access from the first port 212 to the IOSA/GIODRV unit 266D if the access from the first port 212 is to any of the shared memory blocks 232D and 234D.

The second multiplexer 254D routes access from the second port 214 to one of the IOSA/GIODRV units 262 or 264D if the access from the second port 214 is to one of the dedicated memory areas 208 and 210. Alternatively, the second multiplexer 254D routes access from the second port 214 to the IOSA/GIODRV unit 264D if the access from the second port 214 is to any of the shared memory blocks 232D and 234D.

Note that in the example of FIG. 15, the IOSA/GIODRV unit 264D is shared for access by second port 214 to the dedicated area 210 and to the shared memory blocks 232D and 234D. However, the present invention may also be practiced when two separate IOSA/GIODRV units are fabricated with one being used for access by the second port 214 to the dedicated area 210 and another being used for access by the second port 214 to the shared memory blocks 232D and 234D.

Further referring to FIG. 15, a first set of global I/O lines (GIO/GIOB) 502 and 504 are formed between the IOSA/GIODRV units 266D and 264D for access to the left shared memory block 234D. In addition, a second set of global I/O lines (GIO/GIOB) 506 and 508 are formed between the IOSA/GIODRV units 266D and 264D for access to the right shared memory block 232D.

Also referring to FIG. 15, a first set of multiplexers 512 and 514 is formed for the IOSA/GIODRV unit 266D corresponding to the first port 212, and a second set of multiplexers 516 and 518 is formed for the IOSA/GIODRV unit 264D corresponding to the second port 214. The multiplexers 512 and 514 select between the first set of global I/O lines (GIO/GIOB) 502 and 504 or the second set of global I/O lines (GIO/GIOB) 506 and 508 to be coupled to the IOSA/GIODRV unit 266D corresponding to the first port 212 according to port authority.

If the first port 212 has authority for access to the left shared memory block 234D, then the multiplexers 512 and 514 select the first set of global I/O lines (GIO/GIOB) 502 and 504 to be connected to the IOSA/GIODRV unit 266D corresponding to the first port 212. If the first port 212 has authority for access to the right shared memory block 232D, then the multiplexers 512 and 514 select the second set of global I/O lines (GIO/GIOB) 506 and 508 to be connected to the IOSA/GIODRV unit 266D corresponding to the first port 212.

The multiplexers 516 and 518 select between the first set of global I/O lines (GIO/GIOB) 502 and 504 or the second set of global I/O lines (GIO/GIOB) 506 and 508 to be coupled to the IOSA/GIODRV unit 264D corresponding to the second port 214 according to port authority. If the second port 214 has authority for access to the left shared memory block 234D, then the multiplexers 516 and 518 select the first set of global I/O lines (GIO/GIOB) 502 and 504 to be connected to the IOSA/GIODRV unit 264D corresponding to the second port 214. If the second port 214 has authority for access to the right shared memory block 232D, then the multiplexers 516 and 518 select the second set of global I/O lines (GIO/GIOB) 506 and 508 to be connected to the IOSA/GIODRV unit 264D corresponding to the second port 214.

In FIG. 15, the number of IOSA/GIODRV units is reduced from those in FIG. 7. The multiplexers 512, 514, 516 and 518 and the additional global I/O lines 502, 504, 506, and 508 are formed as part of the memory array of the shared memory blocks 232D and 234D. Thus, such components do not significantly add to the area of the shared memory blocks 232D and 234D. Thus, the integrated circuit area for the memory device 200D is advantageously reduced.

Generally, in each of FIGS. 11 and 12, the total number of global I/O lines through the shared memory area 206 is N-times the respective total number of global I/O lines through each of the dedicated memory areas 204, 208, and 210. In the embodiments of FIGS. 11 and 12, N is the number of ports having shared access to the shared memory area 206. Also generally in FIG. 15, the total number of global I/O lines through the shared memory area 206 is N-times the respective total number of global I/O lines through each of the dedicated memory areas 204, 208, and 210. In the embodiment of FIG. 15, N is the number of shared memory blocks formed in the shared memory area 206.

Thus, the embodiments of FIGS. 11 and 12 are advantageous over that of FIG. 15 for minimized number of global I/O lines when the number of shared memory blocks formed in the shared memory area 206 is greater than the number of ports sharing access to the shared memory area 206. Alternatively, the embodiment of FIG. 15 is advantageous over those of FIGS. 11 and 12 for minimized number of global I/O lines when the number of ports sharing access to the shared memory area 206 is greater than the number of shared memory blocks formed in the shared memory area 206.

The foregoing is by way of example only and is not intended to be limiting. Thus, any number of elements as illustrated and described herein is by way of example only. In addition, the present invention has been described for the multi-port semiconductor DRAM device. However, the present invention may be practiced for any type of dual-port memory device having a shared memory area. In addition, the present invention may be practiced with any type of memory unit for each of the dedicated memory area(s), the shared memory bank(s), and the shared memory block(s).

The present invention is limited only as defined in the following claims and equivalents thereof.

The invention claimed is:

1. A multi-port memory device comprising:
    a first port;
    a second port;
    a first dedicated memory area assigned to the first port;
    a plurality of shared memory units having shared access by the first and second ports;
    a first set of I/O lines for the first dedicated memory area; and
    a second set of I/O lines for the shared memory units,
    wherein said second set has more I/O lines than said first set,
    and wherein each of the first set of I/O lines is formed adjacent a respective one of columns or rows of memory cells within the first dedicated memory area, and wherein each of the second set of I/O lines is formed adjacent a respective one of columns or rows of memory cells within the shared memory unit.

2. The multi-port memory device of claim 1, wherein said second set has N times more I/O lines than said first set, with N being a number of ports of the multi-port memory device, and wherein the second set includes a respective set of I/O lines formed adjacent columns or rows of memory cells within the shared memory unit for the first port and includes another respective set of I/O lines formed adjacent columns or rows of memory cells within the shared memory unit for the second port.

3. The multi-port memory device of claim 2, further comprising:
    a respective set of I/O drivers/sensors for providing access to each of the shared memory units by the first and second ports;
    local multiplexers, each coupling data from a selected memory cell to a selected one of the I/O lines for the first and second ports according to port authority;
    a second dedicated memory area assigned to the second port;
    a third set of I/O lines for the second dedicated memory area;
    wherein said second set has more I/O lines than said third set;
    a respective multiplexer for routing respective access for each of the first and second ports between the shared memory units and a respective one of the first and second dedicated memory areas; and
    a respective set of I/O drivers/sensors formed for each of the first and second dedicated memory areas;
    wherein a respective set of I/O drivers/sensors are shared between one of the dedicated memory areas and one of the shared memory units.

4. The multi-port memory device of claim 3, wherein the I/O lines are global I/O lines, the I/O drivers are global I/O line drivers, and I/O sensors are I/O sense amplifiers coupled to the global I/O lines, and wherein the multi-port memory device further comprises:

a respective set of CSLs (column select lines) formed for each of the shared memory units and each of the dedicated memory areas.

5. The multi-port memory device of claim 3, wherein said second set has N times more I/O lines than said first set, with N being a number of the shared memory units.

6. The multi-port memory device of claim 5, further comprising:
a respective set of I/O drivers/sensors formed for each of the first and second ports;
multiplexers for connecting the second set of I/O lines to a selected one of the respective sets of I/O drivers for the first and second ports according to port authority;
a second dedicated memory area assigned to the second port;
a third set of I/O lines for the second dedicated memory area;
wherein said second set has more I/O lines than said third set;
a respective multiplexer for routing respective access for each of the first and second ports between the shared memory units and a respective one of the first and second dedicated memory areas; and
a respective set of I/O drivers/sensors formed for each of the first and second dedicated memory areas;
wherein a respective set of I/O drivers/sensors are shared between one of the dedicated memory areas and one of the shared memory units.

7. The multi-port memory device of claim 6, wherein the I/O lines are global I/O lines, the I/O drivers are global I/O line drivers, and I/O sensors are I/O sense amplifiers coupled to the global I/O lines, and wherein the multi-port memory device further comprises:
a respective set of CSLs (column select lines) formed for each of the shared memory units and each of the dedicated memory areas.

8. The multi-port memory device of claim 1, wherein the memory device is a DRAM (dynamic random access memory) device, and wherein the shared memory units are shared memory blocks of at least one shared memory bank.

9. A multi-port memory device, comprising:
a first port;
a second port;
a first dedicated memory area assigned to the first port;
a second dedicated memory area assigned to the second port;
a plurality of shared memory units with shared access by the first and second ports via global I/O lines, wherein a respective first set of global I/O lines is formed adjacent rows or columns of memory cells in each shared memory unit for access by only the first port, and wherein a respective second set of global I/O lines is formed adjacent rows or columns of memory cells in each shared memory unit for access by only the second port; and
at least one multiplexer for routing respective access for each of the shared memory units via one of the first and second sets of the global I/O lines to a respective one of the first and second ports according to port authority.

10. The multi-port memory device of claim 9, further comprising:
a respective set of CSLs (column select lines), global I/O drivers, and I/O sense amplifiers for each of the shared memory units.

11. The multi-port memory device of claim 9, further comprising:
a respective set of global I/O lines that route data of the shared memory units for each of the first and second ports; and
local multiplexers, each coupling data of the shared memory units to a selected one of the global I/O lines for the first and second ports according to the port authority.

12. The multi-port memory device of claim 9, wherein the memory device is a DRAM (dynamic random access memory) device, and wherein the shared memory units are shared memory blocks of at least one shared memory bank.

* * * * *